United States Patent
Yen et al.

(10) Patent No.: US 6,376,384 B1
(45) Date of Patent: *Apr. 23, 2002

(54) MULTIPLE ETCH CONTACT ETCHING METHOD INCORPORATING POST CONTACT ETCH ETCHING

(75) Inventors: Tzu-Shih Yen; Erik S. Jeng; I-Ping Lee; Eddy Chiang, all of Hsin-Chu (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/557,398

(22) Filed: Apr. 24, 2000

(51) Int. Cl.[7] ........................ H01L 21/302; H01L 21/461
(52) U.S. Cl. ........................ 438/706; 438/637; 438/638; 438/706; 438/727; 438/724; 438/738; 438/743; 438/744; 438/963
(58) Field of Search ................................. 438/637, 638, 438/706, 723, 724, 738, 743, 744, 963

(56) References Cited

U.S. PATENT DOCUMENTS

| | | | |
|---|---|---|---|
| 5,550,071 A | 8/1996 | Ryou | 437/41 |
| 5,554,557 A | 9/1996 | Koh | 437/52 |
| 5,817,579 A | * 10/1998 | Ko et al. | 438/740 |
| 5,872,061 A | * 2/1999 | Lee et al. | 438/705 |
| 5,948,701 A | * 9/1999 | Chooi et al. | 438/694 |
| 6,228,739 B1 | * 5/2001 | Ha et al. | 438/398 |

OTHER PUBLICATIONS

Egitto et al., "Plasma Etching Organic Materials. I. Polyimide in $O_2$–$CF_4$", Journal Vac. Sci. Technol. B 3 (3), May/Jun. 1985, pp. 893–904.

* cited by examiner

Primary Examiner—John F. Niebling
Assistant Examiner—David A. Zarneke
(74) Attorney, Agent, or Firm—George O. Saile; Stephen B. Ackerman; Stephen G. Stanton

(57) ABSTRACT

A method for forming a via through a silicon oxide layer. There is first provided a substrate. There is then formed over the substrate a patterned silicon nitride layer which defines a contact region beneath the patterned silicon nitride layer. There is then formed over the patterned silicon nitride layer a silicon oxide layer. There is then etched the silicon oxide layer while employing a reactive ion etch (RIE) method employing a first etchant gas composition comprising a fluorocarbon etchant gas to form: (1) an etched silicon oxide layer which exposes the contact region without substantially etching the patterned silicon nitride layer; and (2) a fluorocarbon polymer residue layer formed upon at least one of the etched silicon oxide layer and the patterned silicon nitride layer. Finally, there is stripped from the substrate the fluorocarbon polymer residue layer while employing a downstream plasma etch method employing a second etchant gas composition comprising a fluorocarbon etchant gas and oxygen. The method may also be employed in general for etching silicon oxide layers in the presence of silicon nitride layers. Similarly, the method may also in general be employed in removing fluorocarbon polymer residue layers from integrated circuit layers including but not limited to silicon oxide layers and silicon nitride layers.

22 Claims, 3 Drawing Sheets

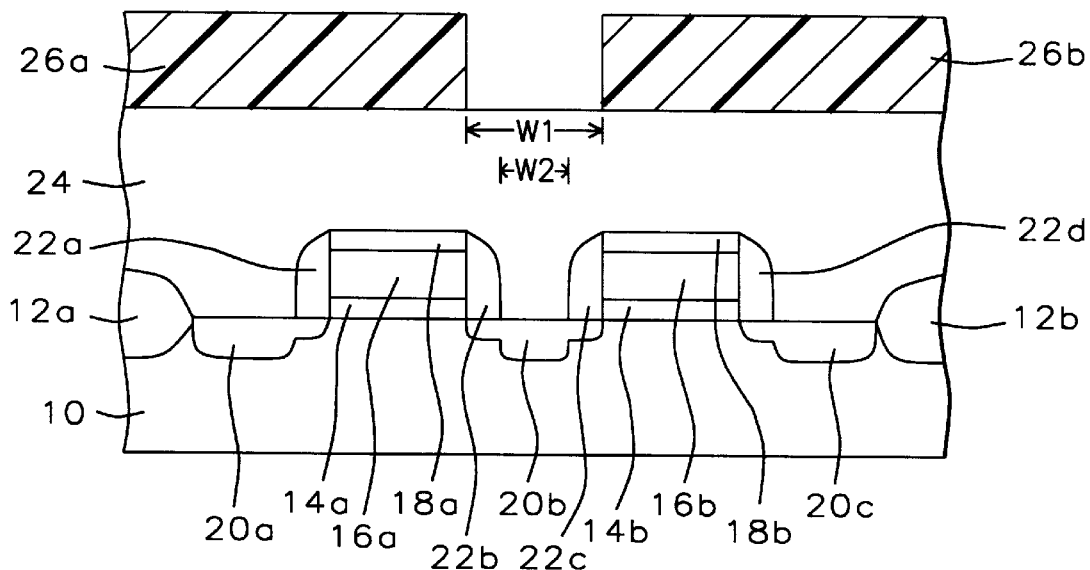
FIG. 1 – Prior Art
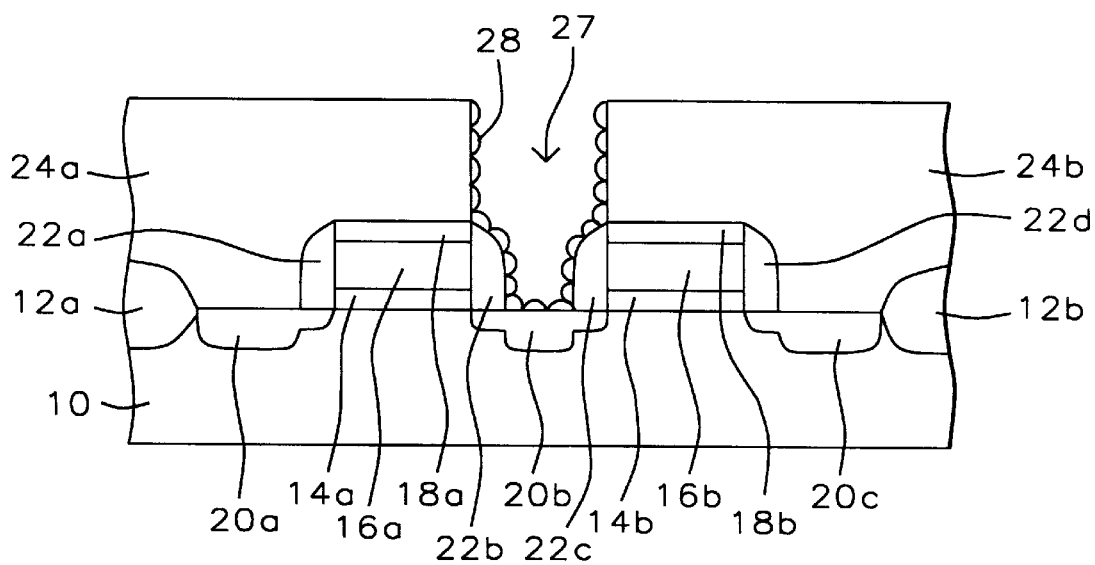
FIG. 2 – Prior Art

MULTIPLE ETCH CONTACT ETCHING METHOD INCORPORATING POST CONTACT ETCH ETCHING

CROSS-REFERENCE TO RELATED APPLICATION

This application is related to co-assigned application Ser. No. 08/835,577, filed Apr. 9, 1997, now U.S. Pat. No. 5,817,579, issued Oct. 6, 1998, the teachings of which are incorporated herein fully by reference.

BACKGROUND OF THE INVENTION

1. Field of the Invention

The present invention relates generally to methods for forming vias through dielectric layers within microelectronic fabrications. More particularly, the present invention relates to methods for forming residue free vias through dielectric layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication device densities have increased and microelectronic fabrication device dimensions have decreased, it has become increasingly important within advanced microelectronic fabrications to form through dielectric layers within those advanced microelectronic fabrications vias, such as but not limited to contact vias and interconnection vias, of similarly commensurately decreased cross-sectional dimensions such that the vias may be formed through the dielectric layers within the advanced microelectronic fabrications without compromising the enhanced levels of integration desired within the advanced microelectronic fabrications.

A representative but by no means limiting integrated circuit microelectronic fabrication structure which illustrates one of several problems encountered when forming through a dielectric layer within an advanced integrated circuit microelectronic fabrication a contact via within the advanced integrated circuit microelectronic fabrication is illustrated by the schematic cross-sectional diagram of FIG. 1.

Shown in FIG. 1 is a semiconductor substrate 10 having formed therein an active region of the semiconductor substrate 10 defined by a pair of isolation regions 12a and 12b. Within and upon the active region of the semiconductor substrate 10 is formed an adjoining pair of field effect transistors (FETs) which share a source/drain region 20b formed within the active region of the semiconductor substrate 10. Employed in forming the adjoining pair of field effect transistors (FETs) is a pair of gate electrode stacks comprising: (1) a pair of gate dielectric layers 14a and 14b having formed and aligned thereupon; (2) a pair of gate electrode layers 16a and 16b which in turn have formed and aligned thereupon; (3) a pair of gate electrode dielectric cap layers 18a and 18b. In addition, there is formed within the semiconductor substrate 10 adjoining the pair of gate electrode stacks a series of source/drain regions 20a, 20b and 20c which are partially obscured by a series of dielectric spacer layers 22a, 22b, 22c and 22d formed adjoining the edges of the pair of gate electrode stacks. Finally, there is shown within FIG. 1 a blanket planarized premetal metal dielectric (PMD) layer 24 formed over the semiconductor substrate 10 including the adjoining pair of field effect transistors (FETs), where the blanket planarized pre-metal dielectric (PMD) layer 24 has formed thereupon a pair of patterned photoresist layers 26a and 26b.

As is understood by a person skilled in the art, when the gate electrode stacks within FIG. 1 are formed with a first separation width W1 upon the active region of the semiconductor substrate 10 and the first separation width W1 approximates a minimum resolvable separation width achievable with an advanced photoexposure apparatus, a second separation width W2 of the pair of dielectric spacer layers 22b and 22c which is typically formed adjoining the pair of gate electrode stacks while employing a self aligned reactive ion etch (RIE) anisotropic etching method will of necessity be less than the minimum resolvable separation width achievable with the advanced photoexposure apparatus. Similarly, presuming that the same photoexposure apparatus is employed in forming the patterned photoresist layers 26a and 26b as is employed in defining the separation width W1 of the gate electrode stacks, the patterned photoresist layers 26a and 26b will also have a minimum separation width W1 which approximates the minimum separation width achievable with the advanced photoexposure apparatus. The patterned photoresist layers 26a and 26b will also have a registration tolerance variation (not shown in FIG. 1) which typically displaces the patterned photoresist layers 26a and 26b with respect to the gate electrode stacks.

In order to avoid forming an oversized and misaligned contact via through the portion of the blanket planarized pre-metal dielectric (PMD) layer 24 between the dielectric spacer layers 22b and 22c when accessing the source/drain region 20b within the active region of the semiconductor substrate 10, it is known in the art to employ a selective reactive ion etch (RIE) method which forms, in part, the contact via through the blanket planarized pre-metal dielectric (PMD) layer 24 in a self aligned fashion. The results of forming the contact via through such a selective reactive ion etch (RIE) method are illustrated in FIG. 2.

Shown in FIG. 2 is a schematic cross-sectional diagram of an integrated circuit microelectronic fabrication otherwise equivalent to the integrated circuit microelectronic fabrication whose schematic cross-sectional diagram is illustrated in FIG. 1, but wherein the contact via 27 has been etched while employing the selective reactive ion etch (RIE) method to expose the portion of the source/drain region 20b not obscured by the dielectric spacer layers 22b and 22c. As illustrated within FIG. 2, the selective reactive ion etch (RIE) method etches the dielectric material from which is formed the blanket planarized pre-metal dielectric (PMD) layer 24 but does not appreciably etch the dielectric material from which is formed the dielectric spacer layers 22b and 22c. Within typical integrated circuit microelectronic fabrications analogous or equivalent to the integrated circuit microelectronic fabrication whose schematic cross-sectional diagram is illustrated in FIG. 1 and FIG. 2, it is common in the art of integrated circuit fabrication to employ pre-metal dielectric (PMD) layers, such as the blanket planarized pre-metal dielectric (PMD) layer 24, formed from a silicon oxide dielectric material, while simultaneously employing dielectric spacer layers, such as the dielectric spacer layers 22b and 22c, formed from a silicon nitride dielectric material. When employing within an integrated circuit whose schematic cross-sectional diagram is analogous or equivalent to the integrated circuit whose schematic cross-sectional diagram is illustrated in FIG. 1 a pre-metal dielectric (PMD) layer formed of a silicon oxide dielectric material and a dielectric spacer layer formed of a silicon nitride material, it is possible to employ a selective reactive ion etch (RIE)

method which typically employs a novel etchant gas composition comprising a fluorocarbon etchant gas to form with a substantial etch selectivity of the pre-metal dielectric (PMD) layer with respect to the dielectric spacer layer within the integrated circuit microelectronic fabrication whose schematic cross-sectional diagram is illustrated in FIG. 2.

While the use of a selective reactive ion etch (RIE) method employing a novel etchant gas composition comprising a perfluorocarbon etchant gas may readily provide from the integrated circuit microelectronic fabrication whose schematic cross-sectional diagram is illustrated in FIG. 1 the integrated circuit microelectronic fabrication whose schematic cross-sectional diagram is illustrated in FIG. 2 without compromising the width of the contact via 27 accessing the source/drain region 20b, under such circumstances the integrated circuit microelectronic fabrication whose schematic cross-sectional diagram is illustrated in FIG. 2 is typically not formed without problems. In particular, there is typically formed, as illustrated in FIG. 2, a fluorocarbon polymer residue layer 28 within the contact via 27 upon at least either the pair of patterned planarized pre-metal dielectric (PMD) layers 24a and 24b or the pair of dielectric spacer layers 22b and 22c. As is similarly illustrated in FIG. 2, the fluorocarbon polymer residue layer 28 within the contact via 27 is difficult to remove and typically remains within the contact via 27 even when exposed to methods and materials employed in stripping the patterned photoresist layers 26a and 26b to yield the integrated circuit microelectronic fabrication whose schematic cross-sectional diagram is illustrated in FIG. 2. Residue layers, such as the fluorocarbon polymer residue layer 28, formed within vias, such as the contact via 27 as illustrated in FIG. 2, are undesirable within advanced integrated circuit microelectronic fabrication since those residue layers typically provide high contact resistances to conductor stud layers formed within the vias.

It is thus towards the goal of forming within microelectronic fabrications including but not limited to integrated circuit microelectronic fabrications vias, such as but not limited to contact vias and interconnection vias, through dielectric layers within those microelectronic fabrications, while avoiding fluorocarbon polymer residue layers formed within those vias, that the present invention is generally directed.

Various disclosures may be found pertaining to microelectronic layer etch methods, such as microelectronic layer reactive ion etch (RIE) methods, for general etching of microelectronic layers within microelectronic fabrications, as well as for etching integrated circuit microelectronic layers when forming integrated circuit microelectronic structures within integrated circuit microelectronic fabrications.

For example, Egitto et al., in "Plasma Etching Organic Materials. I. Polyimide in O2-CF4," disclose several characteristics of binary mixtures of oxygen and carbon tetrafluoride employed as etchant gas compositions when etching, while employing reactive ion etch (RIE) methods, microelectronic layers formed of polyimide materials. At carbon tetrafluoride concentrations of about 20 volume percent within a binary mixture with oxygen there is provided a reactive ion etch (RIE) etchant gas composition with optimally enhanced polyimide etch rate in comparison with a pure oxygen etchant gas composition within an otherwise equivalent reactive ion etch (RIE) plasma etch method.

In addition, Ryou, in U.S. Pat. No. 5,550,071 discloses an etching method for forming a conductor layer within a micro contact via accessing a semiconductor device electrode within a semiconductor integrated circuit microelectronic fabrication. The conductor layer and the micro contact via may be formed with a width narrower than an aperture within a patterned photoresist layer employed in defining the location and width of the conductor layer and micro contact via.

Finally, Koh et al., in U.S. Pat. No. 5,554,557 disclose an etching method for forming within an integrated circuit microelectronic fabrication a fence shaped capacitor having formed therein a capacitor node self aligned upon an integrated circuit microelectronic device electrode within the integrated circuit microelectronic fabrication. The method employs two sets of sidewall spacers in forming the fence shaped capacitor.

Desirable in the art are additional methods through which vias, such as but not limited to contact vias and interconnection vias, may be formed within microelectronic fabrications, such as but not limited to integrated circuit microelectronic fabrications. Particularly desirable in the art are additional methods through which vias, such as but not limited to contact vias and interconnection vias, may be formed in a self aligned fashion within microelectronic fabrications, such as but not limited to integrated circuit microelectronic fabrications. Most particularly desirable in the art are additional methods through which vias, such as but not limited to contact vias and interconnection vias, may be formed in a self aligned fashion through silicon oxide dielectric layers within microelectronic fabrications, such as but not limited to integrated circuit microelectronic fabrications, while: (1) employing reactive ion etch (RIE) methods which employ perfluorocarbon etchant gas compositions; and (2) avoiding fluorocarbon polymer residue layers formed within those vias.

It is towards the foregoing objects that the present invention is both generally and more specifically directed.

SUMMARY OF THE INVENTION

A first object of the present invention is to provide a method for forming a via, such as but not limited to a contact via or an interconnection via, through a dielectric layer within a microelectronic fabrication.

A second object of the present invention is to provide a method in accord with the first object of the present invention, where the via is formed employing a self aligned method through the dielectric layer within the microelectronic fabrication.

A third object of the present invention is to provide a method in accord with the first object of the present invention and the second object of the present invention, where there is avoided when forming the via through the dielectric layer within the microelectronic fabrication while employing the self aligned method a fluorocarbon polymer residue layer formed within the via.

A fourth object of the present invention is to provide a method in accord with the first object of the present invention, the second object of the present invention or the third object of the present invention, which method is readily commercially implemented.

In accord with the objects of the present invention, there is provided a method for forming a via through a dielectric layer within a microelectronic fabrication. To practice the method of the present invention, there is first provided a substrate. There is then formed over the substrate a patterned silicon nitride layer which defines within the microelectronic fabrication a contact region beneath the patterned silicon nitride layer. There is then formed over the patterned silicon nitride layer a silicon oxide layer. The silicon oxide layer is then etched while employing a reactive ion etch (RIE) method employing a first etchant gas composition comprising a fluorocarbon etchant gas to form: (1) a patterned silicon oxide layer having a via formed therethrough which exposes the contact region without substantially etching the patterned silicon nitride layer; and (2) a fluorocarbon polymer residue layer formed upon at least one of the patterned silicon oxide layer and the patterned silicon nitride layer. Finally, there is stripped from the substrate the fluorocarbon polymer residue layer while employing a down stream plasma etch method employing a second etchant gas composition comprising a fluorocarbon etchant gas and an oxidizing gas.

The method of the present invention also contemplates that there may in general be formed while employing the method of the present invention etched silicon oxide layers in the presence of silicon nitride layers while avoiding fluorocarbon polymer residue layers formed upon those etched silicon oxide layers and/or silicon nitride layers.

Similarly, the method of the present invention also contemplates in general a method for stripping fluorocarbon polymer residue layers from microelectronic layers including but not limited to silicon oxide layers and silicon nitride layers within microelectronic fabrications including but not limited to integrated circuit microelectronic fabrications.

In accord with the present invention, there is provided a self aligned method for forming a via through a dielectric layer within a microelectronic fabrication while avoiding a fluorocarbon polymer residue layer formed within the via through the dielectric layer. By: (1) employing within the method of the present invention a patterned silicon nitride layer which defines a contact region formed beneath the patterned silicon nitride layer; and (2) forming, while employing a reactive ion etch (RIE) method, through a silicon oxide layer formed upon the patterned silicon nitride layer a via accessing the contact region while not substantially etching the patterned silicon nitride layer, there is formed, while employing the present invention, a via through a self aligned method through a dielectric layer within a microelectronic fabrication. By employing within the method of the present invention a downstream plasma etch method employing a second etchant gas composition comprising a fluorocarbon etchant gas and an oxidizing gas to strip from the substrate the fluorocarbon polymer residue layer, there is removed, and therefore within the context of the present invention avoided, the fluorocarbon polymer residue layer when forming the via through the self aligned method through the dielectric layer. Within both the method of the present invention and the preferred embodiment of the method of the present invention removal of a fluorocarbon polymer residue layer is intended as synonymous with avoidance of a fluorocarbon polymer residue layer.

The method of the present invention is readily commercially implemented. The method of the present invention provides that there is employed within the method of the present invention: (1) a substrate having formed thereover a patterned silicon nitride layer which defines a contact region formed beneath the patterned silicon nitride layer; (2) a silicon oxide layer formed upon the patterned silicon nitride layer; (3) a reactive ion etch (RIE) method employing a first etchant gas composition comprising a fluorocarbon etchant gas; and (4) a downstream plasma etch method employing a second etchant gas composition comprising a fluorocarbon etchant gas and an oxidizing gas. Methods and materials through which the foregoing layers, reactive ion etch (RIE) method and downstream plasma etch method may be employed within microelectronic fabrications are generally known within the art of microelectronic fabrication. Thus, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating a fluorocarbon polymer residue layer formed within a via through a dielectric layer within an integrated circuit microelectronic fabrication when the via is formed through the dielectric layer within the integrated circuit microelectronic fabrication while employing a self aligned method conventional in the art of integrated circuit microelectronic fabrication.

DESCRIPTION OF THE PREFERRED EMBODIMENT

Figure 3:
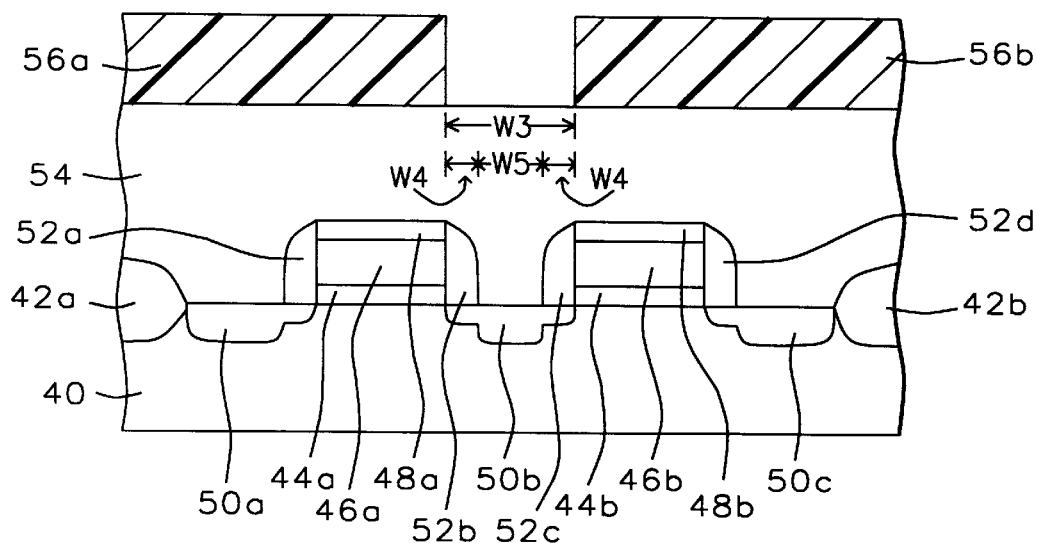
FIG. 3 to FIG. 6 show a series of schematic cross-sectional diagrams illustrating the results of forming while employing a self aligned method in accord with the preferred embodiment of the method of the present invention a via through a dielectric layer within an integrated circuit microelectronic fabrication while avoiding a fluorocarbon polymer residue layer formed within the via through the dielectric layer within the integrated circuit microelectronic fabrication.

The present invention provides a self aligned method for forming a via through a dielectric layer within a microelectronic fabrication while avoiding a fluorocarbon polymer residue layer formed within the via through the dielectric layer. The method of the present invention realizes the foregoing object by forming over a substrate within a microelectronic fabrication a patterned silicon nitride layer which defines a contact region formed beneath the patterned silicon nitride layer within the microelectronic fabrication. The patterned silicon nitride layer then has formed thereupon a silicon oxide layer. There is then etched while employing a reactive ion etch (RIE) method employing a first etchant gas composition comprising a fluorocarbon etchant gas the silicon oxide dielectric layer to form a via through the silicon oxide layer and expose the contact region while not appreciably etching the patterned silicon nitride layer. Through use of the reactive ion etch (RIE) method there is also simultaneously formed a fluorocarbon polymer residue layer within the via. There is then stripped while employing a downstream plasma etch method employing a second etchant gas composition comprising a fluorocarbon etchant gas and an oxidizing gas the fluorocarbon polymer residue layer from within the via.

As is understood by a person skilled in the art, in addition to forming vias through dielectric layers while employing the method of the present invention, the method of the present invention may also in general be employed when etching a silicon oxide layer in the presence of a silicon nitride layer within a microelectronic fabrication in a fashion such that: (1) the silicon oxide layer is etched while not appreciably etching the silicon nitride layer; and (2) there is avoided when etching the silicon oxide layer in the presence of a silicon nitride layer a fluorocarbon polymer residue layer formed upon at least either the etched silicon oxide layer or the silicon nitride layer.

Similarly, as is also understood by a person skilled in the art, the downstream plasma etch method within the method of the present invention may be employed in removing from various microelectronic layers, such as but not limited to silicon oxide layers and silicon nitride layers within microelectronic fabrications, fluorocarbon polymer residue layers. The various microelectronic layers from which may be removed the fluorocarbon polymer residue layers include but are not limited to microelectronic conductor layers, microelectronic semiconductor layers and microelectronic dielectric layers.

Finally, although the preferred embodiment of the present invention illustrates the present invention within the context of forming a via through a silicon oxide layer within the presence of a silicon nitride layer within an integrated circuit microelectronic fabrication, the present invention may similarly be employed in forming vias through silicon oxide layers in the presence of silicon nitride layers within microelectronic fabrications including but not limited to integrated circuit microelectronic fabrications, ceramic substrate microelectronic fabrications, Isolar cell optoelectronic microelectronic fabrications, sensor image array optoelectronic microelectronic fabrications and display image array optoelectronic microelectronic fabrications.

Referring now to FIG. 3 to FIG. 6, there is shown a series of schematic cross-sectional diagrams illustrating the results of progressive stages in forming through a silicon oxide dielectric layer within an integrated circuit microelectronic fabrication a contact via accessing a contact region defined by a patterned silicon nitride layer formed beneath the silicon oxide layer in accord with a preferred embodiment of the present invention. Shown in FIG. 3 is a schematic cross-sectional diagram of the integrated circuit microelectronic fabrication at an early stage in its fabrication in accord with the preferred embodiment of the present invention.

Shown in FIG. 3 is a semiconductor substrate 40 having formed therein an active region of the semiconductor substrate 40 defined by the isolation regions 42a and 42b. Although it is known in the art of integrated circuit microelectronic fabrication that semiconductor substrates are available with either dopant polarity, various dopant concentrations and several crystallographic orientations, for the preferred embodiment of the present invention the semiconductor substrate 40 is preferably a (100) silicon semiconductor substrate having an N- or P- doping. Similarly, although it is also known in the art of integrated circuit microelectronic fabrication that isolation regions may be formed within and/or upon semiconductor substrates to define active regions of semiconductor substrates through several methods, including but not limited to isolation region thermal growth methods and isolation region deposition/patterning methods, for the preferred embodiment of the present invention the isolation regions 42a and 42b are preferably formed within and upon the semiconductor substrate 40 through an isolation region thermal growth method to form isolation regions 42a and 42b of silicon oxide within and upon the semiconductor substrate 40.

There is also shown in FIG. 3 formed within and upon the active region of the semiconductor substrate 40 an adjoining pair of field effect transistors (FETs) which share a source/drain region 50b. As is illustrated in FIG. 3, the adjoining pair of field effect transistors (FETs) includes a pair of gate electrode stacks comprised of: (1) a pair of gate dielectric layers 44a and 44b having formed and aligned thereupon; (2) a pair of gate electrodes 46a and 46b in turn having formed and aligned thereupon; (3) a pair of silicon nitride gate electrode dielectric cap layers 48a and 48b. The adjoining pair of field effect transistors (FETs) also includes: (1) a series of source/drain regions 50a, 50b and 50c formed within the active region of the semiconductor substrate 40 at areas not occupied by the pair of gate electrode stacks; and (2) a series of silicon nitride dielectric spacer layers 52a, 52b, 52c and 52d formed adjoining the pair of gate electrode stacks. Each of the foregoing layers and regions may be formed while employing methods and materials as are conventional in the art of forming such layers and regions within field effect transistors (FETs) within integrated circuits.

Typically and preferably, each gate dielectric layer 44a or 44b within the pair of gate dielectric layers 44a and 44b is formed upon the active region of the semiconductor substrate 40 from a silicon oxide dielectric material formed to a thickness of from about 30 to about 100 angstroms. Typically and preferably, each gate electrode layer 46a or 46b within the pair of gate electrode layers 46a and 46b is formed of a doped polysilicon or polycide material formed and aligned upon the corresponding gate dielectric layer 44a or 44b to a thickness of from about 1000 to about 2000 angstroms. Typically and preferably, each silicon nitride gate electrode dielectric cap layer 48a or 48b within the pair of silicon nitride gate electrode dielectric cap layers 48a and 48b is formed and aligned upon the corresponding gate electrode layer 46a or 46b to a thickness of from about 500 to about 3000 angstroms. Similarly, typically and preferably each source/drain region 50a, 50b or 50c within the series of source/drain regions 50a, 50b and 50c is formed employing a two step ion implantation method employing: (1) a low dose ion implant at an ion implantation dose of from about 1E12 to about 1E14 ions per square centimeter and an ion implantation energy of from about 10 to about 30 keV prior to forming the series of silicon nitride dielectric spacer layers 52a, 52b, 52c and 52d adjoining the gate electrode stacks, followed by; (2) a high dose ion implant at an ion implantation dose of from about 1E14 to about 1E15 ions per square centimeter and an ion implantation energy of from about 5 to about 30 keV after forming the series of silicon nitride dielectric spacer layers 52a, 52b, 52c and 52d adjoining the pair of gate electrode stacks. Finally, the series of silicon nitride dielectric spacer layers 52a, 52b, 52c and 52d is typically and preferably formed employing an anisotropic etching method employing a blanket silicon nitride dielectric layer, as is common in the art of integrated circuit fabrication.

Within the schematic cross-sectional diagram of FIG. 3, the gate electrode stacks are typically and preferably separated by a width W3 of from about 0.1 to about 0.5 microns upon the active region of the semiconductor substrate 40, while the silicon nitride dielectric spacer layers 52b and 52c are each typically and preferably formed with a width W4 of from about 0.02 to about 0.1 microns upon the source/drain region 50b within the active region of the semiconductor substrate 40, thus leaving exposed a source/drain region 50b contact defined by the silicon nitride spacer layers 52a and 52b of a width W5 of about 0.06 to about 0.3 microns, where W3, W4 and W5 are as illustrated in FIG. 3.

Finally, there is shown in FIG. 3 formed over the semiconductor substrate 40 including the adjoining pair of field effect transistors (FETs) a blanket planarized pre-metal dielectric (PMD) layer 54 having formed thereupon a pair of patterned photoresist layers 56a and 56b. Similarly with the layers and regions which comprise the pair of field effect transistors (FETs) formed within and upon the semiconductor substrate 40 beneath the blanket planarized pre-metal dielectric (PMD) layer 54 and the patterned photoresist layers 56a and 56b, the blanket planarized pre-metal dielectric (PMD) layer 54 and the patterned photoresist layers 56a and 56b may with certain limitations also be formed employing methods and materials as are conventional in the art of integrated circuit microelectronic fabrication.

With respect to the blanket planarized pre-metal dielectric (PMD) layer 54, the blanket planarized pre-metal dielectric (PMD) layer 54 is preferably formed of a silicon oxide dielectric material exhibiting optimal etch selectivity of the silicon oxide dielectric material with respect to the silicon nitride material from which is formed the silicon nitride dielectric spacer layers 52a, 52b, 52c and 52d. Preferably the etch selectivity of the silicon oxide dielectric material with respect to the silicon nitride dielectric material is at least about 10:1. Preferably such a silicon oxide dielectric material is formed employing a chemical vapor deposition (CVD) method or a plasma enhanced chemical vapor deposition (PECVD) method, although other deposition methods, such as but not limited to physical vapor deposition (PVD) sputtering methods, may also be employed in forming the blanket planarized pre-metal dielectric (PMD) layer 54. As is understood by a person skilled in the art, the blanket planarized pre-metal dielectric (PMD) layer 54 is typically and preferably formed from a corresponding blanket conformal pre-metal dielectric (PMD) layer which is subsequently planarized while employing a planarizing method as is conventional in the art of microelectronic fabrication, such as but not limited to a reactive ion etch (RIE) etchback planarizing method or a chemical mechanical polish (CMP) planarizing method. Preferably, the blanket planarized pre-metal dielectric (PMD) layer 54 is formed to a thickness of from about 1000 to about 4000 angstroms.

With respect to the patterned photoresist layers 56a and 56b, the patterned photoresist layers 56a and 56b are typically and preferably formed of a novolak positive photoresist material or a polymethylmethacrylate (PMMA) positive photoresist material through which patterned photoresist layers are typically formed with minimal linewidth and/or aperture width within advanced integrated circuit microelectronic fabrications and with optimal stability within advanced integrated circuit microelectronic fabrications, although other photoresist materials, including but not limited to other positive photoresist materials and other negative photoresist materials, may also be employed in forming the patterned photoresist layers 56a and 56b. Preferably, the patterned photoresist layers 56a and 56b are formed to a thickness of from about 5500 to about 12000 angstroms.

Figure 4:
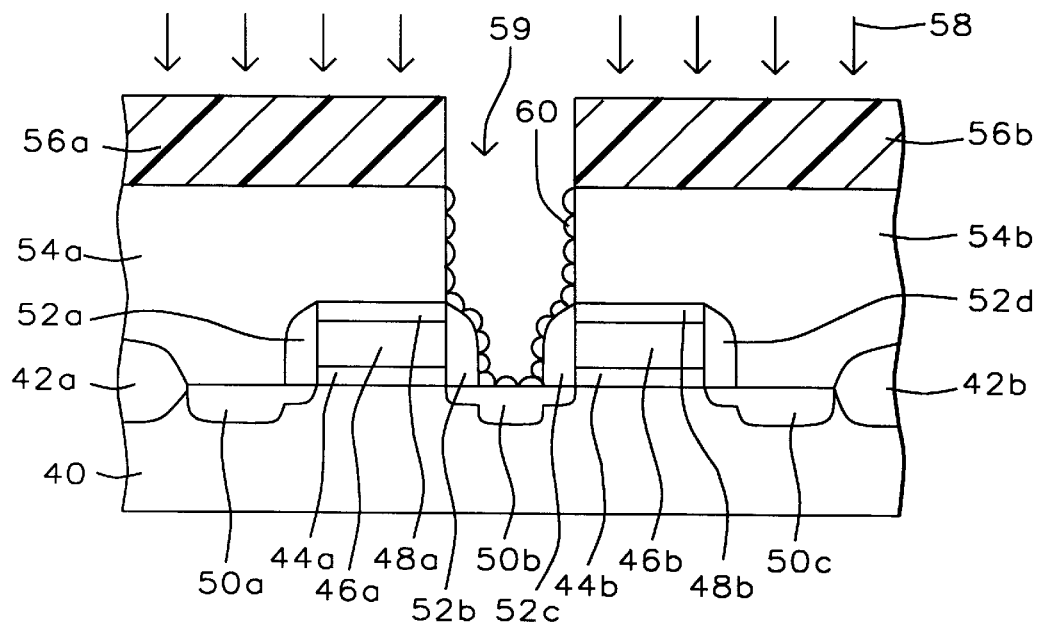

Referring now to FIG. 4, there is shown a schematic cross-sectional diagram illustrating the results of further processing of the integrated circuit microelectronic fabrication whose schematic cross-sectional diagram is illustrated in FIG. 3.

Shown in FIG. 4 is a schematic cross-sectional diagram of an integrated circuit microelectronic fabrication otherwise equivalent to the integrated circuit microelectronic fabrication whose schematic cross-sectional diagram is illustrated in FIG. 3, but wherein there is illustrated the results of etching, while employing a reactive ion etch (RIE) method employing a first plasma 58, a contact via 59 through the blanket planarized pre-metal dielectric (PMD) layer 54 while not substantially etching the silicon nitride dielectric spacer layers 52b and 52c, to thus access the source/drain region 50b contact defined by the silicon nitride dielectric spacer layers 52b and 52c, thus also simultaneously forming the patterned planarized pre-metal dielectric layers 54a and 54b. When forming the contact via 59 through the blanket planarized pre-metal dielectric (PMD) layer 54 to access the source/drain region 50b contact defined by the silicon nitride dielectric spacer layers 52b and 52c without substantially etching the silicon nitride dielectric spacer layers 52b and 52c in accord with the preferred embodiment of the present invention, there is simultaneously formed the fluorocarbon polymer residue layer 60 upon at least either the patterned planarized pre-metal dielectric (PMD) layers 54a and 54b or the silicon nitride dielectric spacer layers 52b and 52c within the contact via 59. Within the context of the preferred embodiment of the present invention, the fluorocarbon polymer residue layer 60 is typically formed as a result of employing within the reactive ion etch (RE) method employed within the preferred embodiment of the method of the present invention the first plasma 58 which etches the blanket planarized pre-metal dielectric (PMD) layer 54 while not substantially etching the silicon nitride dielectric spacer layers 52b and 52c.

For the preferred embodiment of the present invention, it has been found experimentally that a first etchant gas composition employed within the first plasma 58 such that the contact via 59 is formed through the blanket planarized pre-metal dielectric (PMD) layer 54 while not substantially etching the silicon nitride dielectric spacer layers 52a and 52b preferably comprises octafluorocyclobutane (i.e. C4F8), carbon monoxide (i.e. CO) and argon (i.e. Ar), although in place of octafluorocyclobutane other fluorocarbon etchant gases, such as perfluorocarbon etchant gases (including but not limited to carbon tetrafluoride and hexafluoroethane) and hydrofluorocarbon etchant gases (such as but not limited to fluoromethane, difluoromethane and trifluoromethane) may also be employed. More preferably, the first etchant gas composition preferably consists essentially of octafluorocyclobutane, carbon monoxide and argon. Preferably, the first reactive ion etch (RIE) method also employs: (1) a reactor chamber pressure of from about 25 to about 45 mtorr; (2) a radio frequency power of from about 1300 to about 1700 watts at a radio frequency of 13.56 MHZ, without an extrinsic bias power; (3) a semiconductor substrate 40 temperature of from about 20 to about 60 degrees centigrade; (4) an octafluorocyclobutane flow rate of from about 8 to about 24 standard cubic centimeters per minute (sccm); (5) a carbon monoxide flow rate of from about 150 to about 350 standard cubic centimeters per minute (sccm); and (6) an argon flow rate of from about 250 to about 750 standard cubic centimeters per minute (sccm), for a time period sufficient to completely etch the contact via 59 through the blanket planarized pre-metal dielectric (PMD) layer 54 and expose the contact within the source/drain region 50b defined by the silicon nitride dielectric spacer layers 52b and 52c.

Within the context of the foregoing parameters and limits, the first plasma 58 employed within the preferred embodiment of the method of the present invention typically exhibits an etch selectivity of the blanket planarized pre-metal dielectric (PMD) layer 54 with respect to the silicon nitride dielectric spacer layers 52b and 52c of at least about 10:1, and thus the silicon nitride dielectric spacer layers 52b and 52c are not appreciably etched when forming the contact via 59 through the blanket planarized pre-metal dielectric (PMD) layer 54. Similarly, within the preferred embodiment of the present invention the fluorocarbon polymer residue layer 60 is typically formed to a thickness of from about 100 to about 1000 angstroms within the contact via 59.

Figure 5:
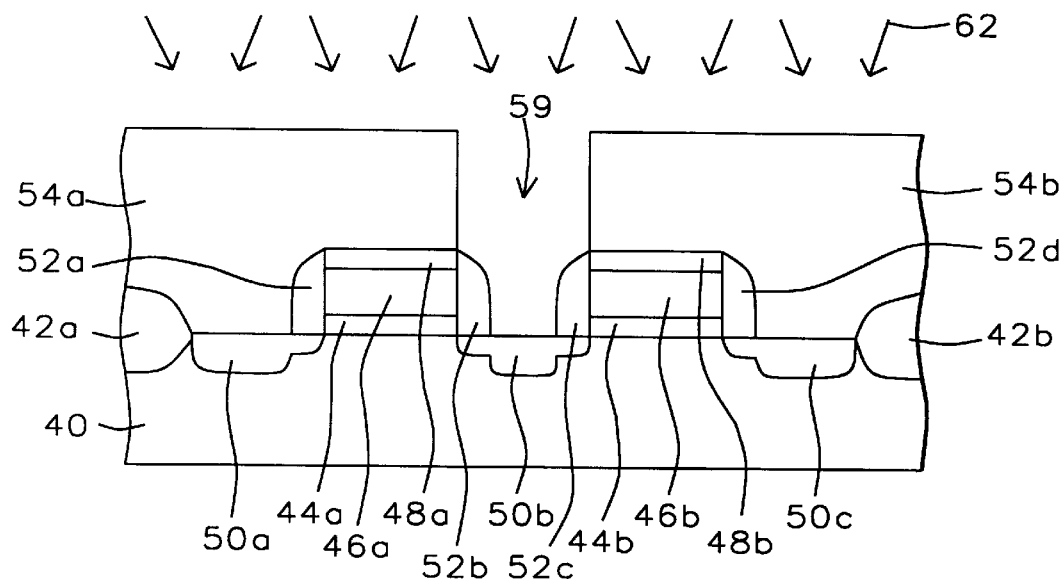

Referring now to FIG. 5, there is shown a schematic cross-sectional diagram illustrating the results of further processing of the integrated circuit microelectronic fabrication whose schematic cross-sectional diagram is illustrated in FIG. 4.

Shown in FIG. 5 is a schematic cross-sectional diagram of an integrated circuit microelectronic fabrication otherwise equivalent to the integrated circuit microelectronic fabrication whose schematic cross-sectional diagram is illustrated in FIG. 4, but from whose surface has been stripped: (1) the patterned photoresist layers 56a and 56b ; and (2) the fluorocarbon polymer residue layer 60. The patterned photoresist layers 56a and 56b, and the fluorocarbon polymer residue layer 60, are preferably stripped from the surface of the integrated circuit microelectronic fabrication whose schematic cross-sectional diagram is illustrated in FIG. 4 to yield the integrated circuit microelectronic fabrication whose schematic cross-sectional diagram is illustrated in FIG. 5 while employing a downstream plasma etch method employing a second plasma 62. Within the preferred embodiment of the method of the present invention, the second plasma 62 exhibits a selectivity for the fluorocarbon polymer residue layer 60 with respect to either the patterned planarized pre-metal dielectric (PMD) layers 54a and 54b, the silicon nitride dielectric spacer layers 52b and 52c or the semiconductor substrate 40. Preferably, within the preferred embodiment of the method of the present invention the second plasma 62 exhibits an etch selectivity ratio of the fluorocarbon polymer residue layer 60 with respect to either the patterned planarized pre-metal dielectric (PMD) layers 54a and 54b, the silicon nitride dielectric spacer layers 52b and 52c or the semiconductor substrate 40 of at least about 20:1.

As is understood by a person skilled in the art, a "downstream plasma," as employed within a downstream plasma etch method, is intended as a plasma which is not generated within the immediate vicinity (nor generally within the same reactor chamber) within which is positioned a substrate which is processed while employing the "downstream plasma." Rather, a "downstream plasma" is formed within a separate reactor chamber, or a separate portion of the same reactor chamber, either upstream of the reactor chamber, or upstream of the separate portion of the reactor chamber, within which is positioned the substrate which is processed while employing the "downstream plasma," and the "downstream plasma" products are conducted downstream to the reactor chamber, or separate portion of the reactor chamber, within which is positioned the substrate which is processed while employing the "downstream plasma" products. Such "downstream plasma" products are believed to be neutral products, such as radicals, which are believed to etch isotropically, rather than ionic species which are more likely to etch anisotropically, particularly when a bias voltage is applied to a substrate when etched within a conventional plasma which is other than a "downstream plasma."

In particular, within the context of the preferred embodiment of the present invention, a "downstream plasma" is particularly desirable when employed as the second plasma 62, insofar as there is substantially inhibited plasma induced damage to the semiconductor substrate 40 at the location of the source/drain region 50b incident to stripping the fluoropolymer residue layer 60 from the sidewalls of the contact via 59 as illustrated within the schematic cross-sectional diagram of FIG. 4, to provide the integrated circuit microelectronic fabrication whose schematic cross-sectional diagram is illustrated in FIG. 5, when employing as the second plasma 62 a "downstream plasma." Such attenuated damage to the semiconductor substrate 40 at the location of the source/drain region 50b will typically be manifested and observed as a decrease in contact resistance of a conductor stud layer formed into the contact via 59, in comparison with circumstances where the fluorocarbon polymer residue layer 60 is stripped from within the contact via 59 employing an otherwise equivalent second plasma 62, which is not a "downstream plasma."

It has been found experimentally within the preferred embodiment of the present invention that the second plasma 62 which effectively strips the patterned photoresist layers 56a and 56b, and more particularly the fluorocarbon polymer residue layer 60, from the integrated circuit microelectronic fabrication whose schematic cross-sectional diagram is illustrated in FIG. 5 while not substantially etching the patterned planarized pre-metal dielectric (PMD) layers 54a and 54b, the silicon nitride dielectric spacer layers 52b and 52c or the semiconductor substrate 40 preferably employs a second etchant gas composition comprising fluorocarbon etchant gas, preferably a carbon tetrafluoride (i.e. CF4) fluorocarbon etchant gas, and an oxidizing gas, preferably an oxygen (i.e. O2) oxidizing gas, more preferably with a carbon tetrafluoride:oxygen volume ratio of from about 1:5 to about 1:20, although: (1) fluorocarbon etchant gases, such as but not limited to perfluorocarbons (including but not limited to carbon tetrafluoride and hexafluoroethane) and hydrofluorocarbons (including but not limited to fluoromethane, difluoromethane and trifluoromethane); and (2) oxidizing gases such as but not limited to oxygen, ozone, nitrous oxide and nitric oxide, may also be employed within analogous or equivalent volume ratios. Yet more preferably, the second plasma 62 employs a second etchant gas composition consisting essentially of carbon tetrafluoride and oxygen, still yet more preferably with a carbon tetrafluoride:oxygen volume ratio of from about 1:5 to about 1:20. Preferably, the second reactive ion etch (RIE) method also employs: (1) a reactor chamber pressure of from about 100 to about 2000 mtorr; (2) a radio frequency power of from about 200 to about 1000 watts at a radio frequency of 13.56 MHZ, without an extrinsic bias power; (3) a semiconductor substrate 40 temperature of from about 40 to about 120 degrees centigrade; (4) a carbon tetrafluoride flow rate of from about 50 to about 300 standard cubic centimeters per minute (sccm); (5) an oxygen flow rate of from about 1000 to about 3000 standard cubic centimeters per minute (sccm); and (6) an exposure time of from about 15 to about 180 seconds.

As is understood by a person skilled in the art, it is also feasible within the method of the present invention that there may be sequentially stripped from the integrated circuit whose schematic cross-sectional diagram is illustrated in FIG. 4: (1) the patterned photoresist layers 56a and 56b while employing an oxygen plasma stripping method as is conventional in the art; prior to stripping (2) the fluorocarbon polymer residue layer 60 while employing the second plasma 62. However, use of such an intermediate oxygen plasma stripping method is typically neither required nor desired within the method of the present invention since the second plasma 62 employed within the present invention and the preferred embodiment of the present invention simultaneously efficiently strips both: (1) the patterned photoresist layers 56a and 56b ; and (2) the fluorocarbon polymer residue layer 60 from the integrated circuit microelectronic fabrication whose schematic cross-sectional diagram is illustrated by FIG. 4 to provide the integrated circuit microelectronic fabrication whose schematic cross-sectional diagram is illustrated in FIG. 5.

Figure 6:
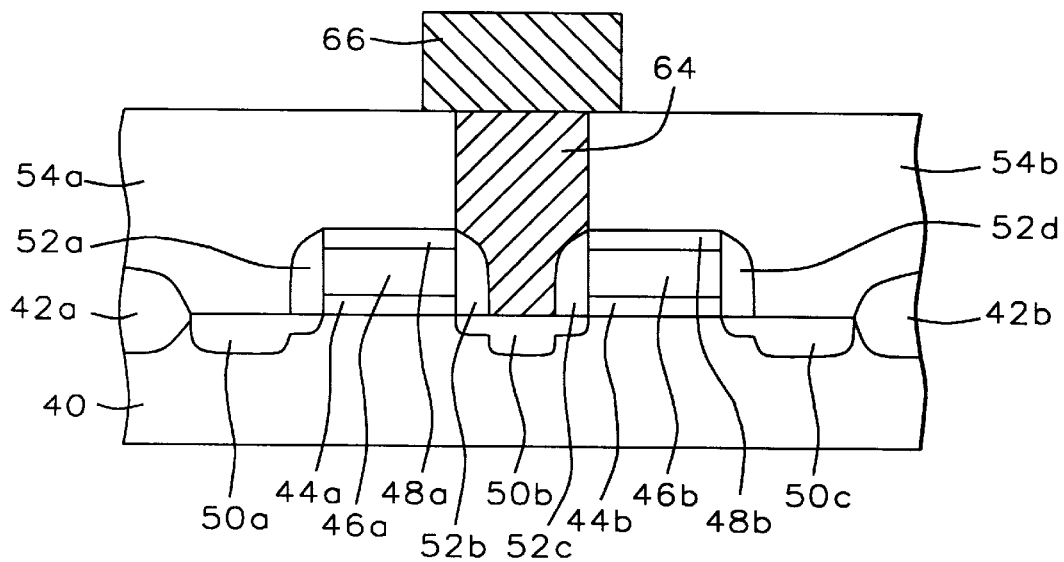

Referring now to FIG. 6, there is shown a schematic cross-sectional diagram illustrating the results of further processing of the integrated circuit microelectronic fabrication whose schematic cross-sectional diagram is illustrated in FIG. 5. Shown in FIG. 6 is a schematic cross-sectional diagram of an integrated circuit microelectronic fabrication otherwise equivalent to the integrated circuit microelectronic fabrication whose schematic cross-sectional diagram is illustrated in FIG. 5, but wherein within the contact via 59 there is formed a conductive contact stud 64 and wherein upon the conductive contact stud 64 there is formed a patterned first conductor layer 66. Both the conductive contact stud 64 and the patterned first conductor layer 66 may be formed employing methods and materials as are conventional in the art of integrated circuit fabrication, such methods including but not limited to thermally assisted evaporation methods, electron beam assisted evaporation methods, chemical vapor deposition (CVD) methods and physical vapor deposition (PVD) sputtering methods through which may be formed conductive contact studs and patterned conductor layers of conductor materials including but not limited to metals, metal alloys, doped polysilicon and polycides. For the preferred embodiment of the present invention, the conductive contact stud 64 is preferably formed at least in part of tungsten metal, as is common in the art of integrated circuit microelectronic fabrication, while the patterned first conductor layer 66 is preferably formed at least in part of an aluminum containing conductor alloy, as is also common in the art of integrated circuit microelectronic fabrication. Preferably, the conductive contact stud 64 is formed to a thickness sufficient to reach the upper surfaces of the patterned planarized pre-metal dielectric (PMD) layers 54a and 54b. Preferably, the patterned first conductor layer 66 is formed to a thickness of from about 1500 to about 3500 angstroms.

Upon forming the conductive contact stud 64 within the contact via 59 within the integrated circuit microelectronic fabrication whose schematic cross-sectional diagram is illustrated in FIG. 6, there is formed through the preferred embodiment of the present invention an integrated circuit having formed therein through a self aligned method a contact via through a dielectric layer, where the contact via subsequently has formed therein a conductive contact stud which exhibits low contact resistance. The method of the present invention achieves this goal by employing: (1) a reactive ion etch (RIE) method which in part provides a self aligned contact via through the dielectric layer; and (2) a downstream plasma etch method which strips from within the contact via a fluorocarbon polymer residue layer which would otherwise provide a high contact resistance to the conductive contact stud formed within the contact via, and where the downstream plasma etch method provides still further reduction in contact resistance since the downstream plasma etch method provides for inhibited plasma induced damage to a contact region accessed by the contact via when stripping from the contact via the fluorocarbon polymer residue layer.

As is understood by a person skilled in the art, although the preferred embodiment of the present invention illustrates the present invention as employed in removing a fluorocarbon polymer residue layer from a contact via formed employing a self aligned method through a dielectric layer within an integrated circuit microelectronic fabrication, the present invention may also be employed in removing fluorocarbon polymer residue layers from within vias other than contact vias formed through dielectric layers within microelectronic fabrications other than integrated circuit microelectronic fabrications. Such other vias may include, but are not limited to, interconnection vias, while such other microelectronic fabrications may include, but are not limited to, ceramic substrate microelectronic fabrications, solar cell optoelectronic microelectronic fabrications, sensor image array optoelectronic microelectronic fabrications and display image array optoelectronic microelectronic fabrications.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments of the present invention which are within the spirit and scope of the present invention, as defined by the accompanying claims.

What is claimed is:

1. A method for removing a fluorocarbon polymer residue layer from a substrate layer comprising:

providing a substrate layer;

forming upon the substrate layer a fluorocarbon polymer residue layer; and stripping from the substrate layer the fluorocarbon polymer residue layer while employing a downstream plasma etch method employing a second etchant gas composition comprising carbon tetrafluoride and oxygen.

2. The method of claim 1 wherein by employing the downstream plasma etch method there is attenuated plasma induced damage to the substrate layer when stripping from the substrate layer the fluorocarbon polymer residue layer while employing the downstream plasma etch method.

3. The method of claim 1 wherein the substrate layer is selected from the group of substrate layers consisting of conductor substrate layers, semiconductor substrate layers and dielectric substrate layers.

4. The method of claim 1 wherein the substrate layer is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

5. The method of claim 1 wherein the fluorocarbon polymer residue layer is formed incident to selectively etching a silicon oxide layer in the presence of a silicon nitride layer formed upon the substrate layer while employing a reactive ion etch (RIE) method employing a first etchant gas composition comprising octafluorocyclobutane, carbon monoxide and argon.

6. The method of claim 1 wherein the downstream plasma etch method employs a carbon tetrafluoride:oxygen volume ratio of from about 1:5 to about 1:20.

7. A method for etching a silicon oxide layer comprising:

providing a substrate;

forming over the substrate a silicon oxide layer;

etching the silicon oxide layer while employing a reactive ion etch (RIE) method employing a first etchant gas composition comprising a fluorocarbon etchant gas to form an etched silicon oxide layer and a fluorocarbon polymer residue layer thereupon; and stripping from the etched silicon oxide layer the fluorocarbon polymer residue layer while employing a downstream plasma etch method employing a second etchant gas composition comprising carbon tetrafluoride and oxygen.

8. The method of claim 7 wherein by employing the downstream plasma etch method there is attenuated plasma induced damage to the etched silicon oxide layer when stripping from the etched silicon oxide layer the fluorocarbon polymer residue layer while employing the downstream plasma etch method.

9. The method of claim 7 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The method of claim 7 wherein the first etchant gas composition comprises octafluorocyclobutane, carbon monoxide and argon.

11. The method of claim 7 wherein the downstream plasma etch method employs a carbon tetrafluoride:oxygen volume ratio of from about 1:5 to about 1:20.

12. A method for selectively etching a silicon oxide layer in the presence of a silicon nitride layer comprising:
   providing a substrate;
   forming over the substrate a silicon oxide layer in contact with a silicon nitride layer;
   etching the silicon oxide layer while employing a reactive ion etch (RIE) method employing a first etchant gas composition comprising a fluorocarbon etchant gas to form an etched silicon oxide layer without substantially etching the silicon nitride layer and a fluorocarbon polymer residue layer formed upon at least one of the etched silicon oxide layer and the silicon nitride layer; and
   stripping from the substrate the fluorocarbon polymer residue layer while employing a downstream plasma etch method employing a second etchant gas composition comprising carbon tetrafluoride and oxygen.

13. The method of claim 12 wherein by employing the downstream plasma etch method there is attenuated plasma induced damage to the substrate when stripping from the substrate the fluorocarbon polymer residue layer while employing the downstream plasma etch method.

14. The method of claim 12 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

15. The method of claim 12 wherein the first etchant gas composition comprises octafluorocyclobutane, carbon monoxide and argon.

16. The method of claim 12 wherein the downstream plasma etch method employs a carbon tetrafluoride:oxygen volume ratio of from about 1:5 to about 1:20.

17. A method for forming a via through a silicon oxide layer comprising:
   providing a substrate;
   forming over the substrate a patterned silicon nitride layer which defines a contact beneath the patterned silicon nitride layer;
   forming over the patterned silicon nitride layer a silicon oxide layer;
   etching the silicon oxide layer while employing a reactive ion etch (RIE) method employing a first etchant gas composition comprising a fluorocarbon etchant gas to form an etched silicon oxide layer which exposes the contact without substantially etching the patterned silicon nitride layer and a fluorocarbon polymer residue layer formed upon at least one of the etched silicon oxide layer and the patterned silicon nitride layer; and
   stripping from the substrate the fluorocarbon polymer residue layer while employing a downstream plasma etch method employing a second etchant gas composition comprising carbon tetrafluoride and oxygen.

18. The method of claim 17 wherein by employing the downstream plasma etch method there is attenuated plasma induced damage to the substrate layer when stripping from the substrate layer the fluorocarbon polymer residue layer while employing the downstream plasma etch method.

19. The method of claim 17 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

20. The method of claim 17 wherein the via is selected from the group of vias consisting of contact vias and interconnection vias.

21. The method of claim 17 wherein the first etchant gas composition comprises octafluorocyclobutane, carbon monoxide and argon.

22. The method of claim 17 wherein the downstream plasma etch method employs a carbon tetrafluoride:oxygen volume ratio of from about 1:5 to about 1:20.

* * * * *